United States Patent [19]
Black
[11] 3,783,399
[45] Jan. 1, 1974

[54] FULL-WAVE MODULATOR-DEMODULATOR AMPLIFIER APPARATUS

[75] Inventor: James M. Black, Lancaster, Calif.

[73] Assignee: The United States of America as represented by the Administrator of the National Aeronautics and Space Administration, Washington, D.C.

[22] Filed: July 13, 1971

[21] Appl. No.: 162,100

[52] U.S. Cl. .......................... 330/9, 330/10, 330/35
[51] Int. Cl. .......................... H03f 1/02
[58] Field of Search .......................... 330/35, 10, 9

[56] References Cited

UNITED STATES PATENTS

| | | | |
|---|---|---|---|
| 2,866,019 | 12/1958 | Pedersen | 330/9 X |
| 3,553,492 | 1/1971 | Bugay | 307/235 |
| 3,613,020 | 10/1971 | McBride | 330/35 X |
| 3,586,989 | 6/1971 | Wheable | 330/35 X |
| 3,510,684 | 5/1970 | Martin | 330/10 X |

*Primary Examiner*—Nathan Kaufman
*Attorney*—Darrell G. Brekke et al.

[57] ABSTRACT

Full-wave modulator-demodulator apparatus including an operational amplifier having a first input terminal coupled to a circuit input terminal, and a second input terminal alternately coupled to the circuit input terminal and a circuit ground by a switching circuit responsive to a phase reference signal whereby the operational amplifier is alternately switched between a non-inverting mode and an inverting mode. The switching circuit includes three field-effect transistors operatively associated to provide the desired switching function in response to an alternating reference signal of the same frequency as an AC input signal applied to the circuit input terminal.

4 Claims, 4 Drawing Figures

INVENTOR.
JAMES M. BLACK
BY
[signature]
ATTORNEY

FULL-WAVE MOD ULATOR-DEMODULATOR AMPLIFIER APPARATUS

The invention described herein was made by an employee of the United States Government and may be manufactured and used by or for the Government for governmental purposes without the payment of any royalties thereon or therefor.

BACKGROUND OF THE INVENTION

1. Field of the Invention

The present invention relates generally to amplifying devices and more particularly to novel solid state full-wave modulator-demodulator amplifier apparatus for generating a rectified (demodulated) output signal proportional to a periodic fixed frequency, variable amplitude AC input signal.

2. Description of the Prior Art

Heretofore, various forms of gated diode bridge demodulator amplifiers have been the most popular prior art devices for performing the function generally referred to as phase reference demodulation or synchronous demodulation. These as well as other prior art devices, however, require the use of transformers and are therefore not readily adaptable for use in systems using modern microelectronic packaging techniques. Furthermore, the transformers are known to exhibit one of the poorest reliability histories of any single amplifier demodulator component, are relatively large, and are very troublesome from the standpoint of electrical noise pickup and spurious signal generation. In addition to poor noise and distortion characteristics, the electrical power consumption of the circuitry used in most prior art devices is relatively high and it has been difficult to make use of simple resistor and capacitor components to obtain the necessary phase shifts of the reference signal. Moreover, input impedance has been relatively low and output impedance relatively high; the opposite of that which is desired.

SUMMARY OF THE PRESENT INVENTION

It is therefore an object of the present invention to provide a novel solid state full-wave modulator-demodulator amplifier which is not subject to the prior art disadvantages pointed out above.

In accordance with the present invention, a chopper circuit driven by a pulsed reference signal is used to alternately switch an operational amplifier from a noninverting mode to an inverting mode of operation during alternate half-cycles of a fixed-frequency AC input signal so that the output signal generated thereby is in the form of a full-wave rectified DC signal. Consequently, the output signal waveform for each half-cycle is an exact duplicate of the corresponding input signal waveform, except that alternate half-cycles are of inverted polarity as determined by the phase relationship between the reference signal and the input signal.

Among the advantages of the present invention are that the output is highly linear, electrical power consumption is substantially lower than in prior art circuits, the required phase reference signal power is extremely low, and the circuit input impedance is high while the output impedance is very low. The apparatus is capable of linear performance over a voltage range of about one microvolt to several volts and is particularly suited to utilization in the low microvolt and high nanovolt ranges. DC offset or bias is completely controllable and can be set to zero with no subsequent resetting required, and DC drift is as good as that of the operational amplifier used.

IN THE DRAWINGS

DETAILED DESCRIPTION OF A PREFERRED EMBODIMENT

Figure 1:
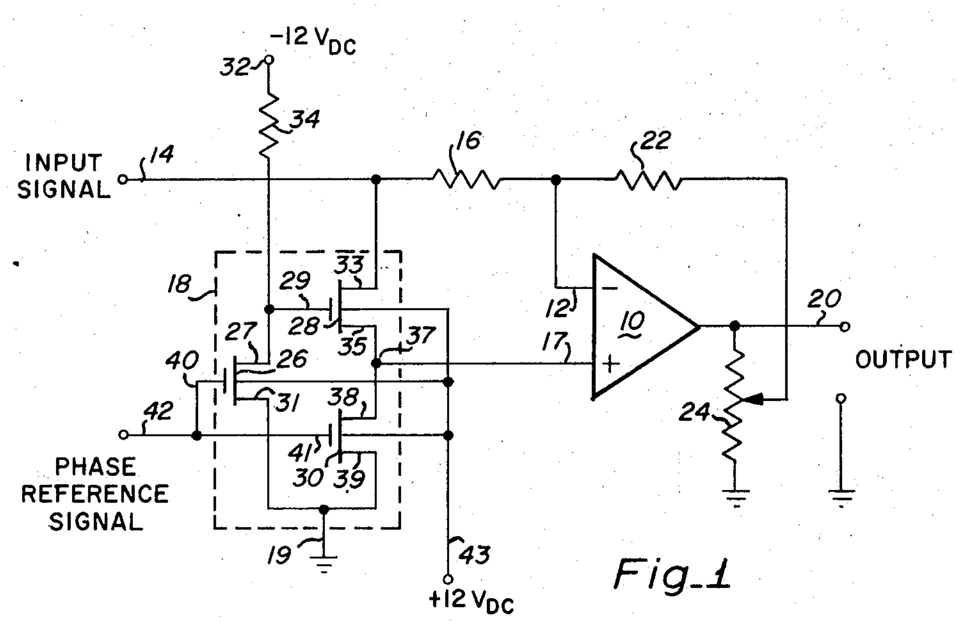
FIG. 1 is a schematic diagram illustrating a full-wave modulator-demodulator amplifier in accordance with the present invention.

Referring now to FIG. 1 of the drawings, an operational amplifier 10 is shown having its inverting input terminal 12 coupled to a circuit input terminal 14 (circuit terminal) through a 100kΩ resistor 16 and its non-inverting input terminal 17 alternately coupled to terminal 14 and a first source of reference potential or circuit ground 19 by a switching circuit 18. The output of amplifier 10 is coupled to an output terminal 20. A 100kΩ resistor 22 provides a feedback path between output terminal 20 and amplifier input terminal 12 via a 10kΩ gain control potentiometer 24 which may alternatively be eliminated. In the illustrated preferred embodiment, a Model μA741 operational amplifier manufactured by Fairchild Semiconductor of Mountain View, California was utilized.

Switching circuit 18 acts as a pulse responsive double-throw single-pole switch for alternately coupling amplifier input terminal 17 to terminal 14 and ground 19, and includes three switching elements in the form of field-effect transistors (FETs) 26, 28 and 30. The drain 27 of FET 26 is coupled to a −12 volt negative bias source (second source of potential) at terminal 32 through a 120kΩ resistor 34 and to the gate 29 of FET 28. The source 31 of FET 26 is coupled to circuit ground 19. The drain 33 of FET 28 is connected to terminal 14 and its source 35 is connected to the noninverting input 17 of operational amplifier 10 at node 37. The drain 38 of FET 30 is also connected to node 37 and its source 39 is connected to circuit ground 19. The gate electrodes 40 and 41 respectively, of FET 26 and FET 30 are coupled to a phase reference input terminal 42. THe substrate (active bulk) of the enhancement mode p-channel MOS FETs 26, 28 and 30 are biased to +12 volts by a source connected to terminal 43. In the preferred embodiment, the integrated circuit chopper device 18 was an MEM2008 series-shunt chopper manufactured by the General Instrument Corp. of Hicksville, N.Y.

Figure 4:
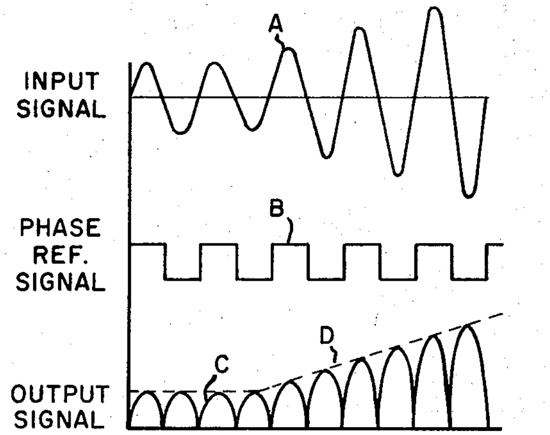
FIG. 4 is a timing diagram illustrating operation of the present invention.

In operation with a fixed-frequency AC input signal A, such as shown in FIG. 4, applied to terminal 14 and a pulse phase reference signal B, such as shown in FIG. 4, of like frequency applied to reference terminal 42, the output signal C developed at output terminal 20 will be a full-wave rectified version of the input signal applied to terminal 14. The output signal waveform for each half-cycle of the output signal is an exact duplicate of the corresponding half-cycle waveform of the input signal for input signals of from one microvolt to several volts since the operation of the circuit over this range is highly linear.

Figure 2:
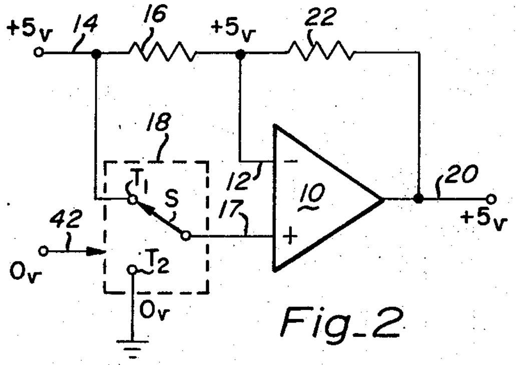
FIG. 2 is a schematic diagram illustrating operation of the circuit shown in FIG. 1 when in the noninverting mode.

To further describe the operation of the embodiment shown in FIG. 1, assume an instantaneous input signal of +5 volts is applied to terminal 14 and a zero potential reference signal is applied to reference terminal 42 to bias the gate 40 of FET 26 at zero volts with respect to the source 31. This will leave the p-channel region depleted of positive carriers and cause FET 26 to be nonconductive. With FET 26 nonconductive, the gate of FET 28 is raised to −12 volts thereby inducing positive carriers into the channel region to render FET 28 conductive to couple input 17 of amplifier 10 to terminal 14. Since the zero volt input reference signal is also applied to gate 41, FET 30 will be biased nonconductive thereby isolating amplifier input 17 from circuit ground 19. This configuration is functionally illustrated in FIG. 2 by the double-throw single-pole switch S in contact with the switch terminal $T_1$, so as to connect amplifier input 17 to terminal 14. Amplifier 10 is thus connected in a noninverting mode and will develop a +5 volt output signal at terminal 20.

Figure 3:
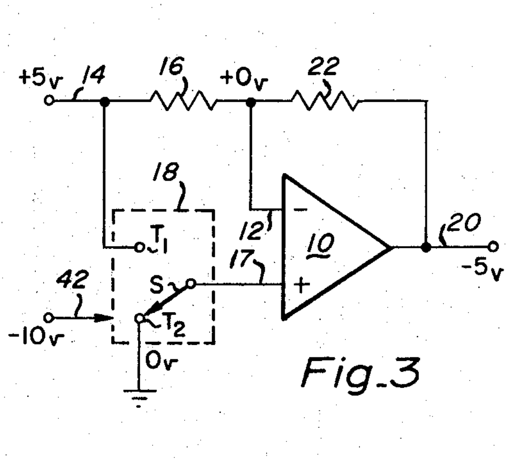
FIG. 3 is a schematic diagram illustrating operation of the circuit shown in FIG. 1 when operated in the inverting mode.

Alternately, with a −10 volt input signal applied to reference terminal 42, FET 26 will be biased conductive pulling the gate 29 of FET 28 to circuit ground thereby rendering FET 28 nonconductive to isolate amplifier input 17 from terminal 14. However, the −10 volt reference signal is also applied to the gate 41 of FET 30 causing it to conduct and couple amplifier input 17 to circuit ground 19. As indicated by switch S contacting terminal $T_2$ in FIG. 3, amplifier 10 is now connected in its inverting mode and will develop a potential at output terminal 20 which is equal but opposite in polarity to the input signal applied at terminal 14 so that the potential at input 12 is equivalent to that at input 17 (0 volts). Thus, as illustrated in FIG. 4, with both an input signal A of fixed frequency but variable amplitude applied to terminal 14 and a pulse phase reference input B applied to reference terminal 42, a full-wave rectified output signal C will be developed at output terminal 20 which can be filtered to provide the corresponding DC output signal D.

The circuit can also be made to function as a modulator by simple modification of the illustrated configuration and can also be used as a voltage-controlled signal polarity reverser without modification other than the use of a DC reference signal rather than the illustrated pulse signal. The inverted as well as the noninverted output signals are generated with a very high degree of purity, i.e., very little or negligible distortion. The present invention utilizes microcircuit techniques to provide an easily packaged general purpose device which can be used to perform a function or functions heretofore not otherwise available.

Although the preferred embodiment has been illustrated with reference to specific components, it is to be understood that the invention is not limited to such embodiments and discrete as well as integrated semiconductors and *n*-channel as well as p-channel FETs may be utilized. Moreover, other operational amplifiers, resistor values and voltage levels may also be utilized. Accordingly, the appended claims are intended to cover all alterations and modifications which fall within the true spirit and scope of the invention.

What is claimed is:

1. Full-wave modulator-demodulator amplifier apparatus comprising:

an operational amplifier having an inverting input terminal, a non-inverting input terminal, and an output terminal;

an a-c signal input terminal;

means for coupling said a-c signal input terminal to said inverting input terminal;

a feedback circuit coupled between said output terminal ans said inverting input terminal;

switching means coupled between said a-c signal input terminal and said non-inverting input terminal for alternately connecting said terminals together and grounding said non-inverting terminal whereby the a-c signal imposed on said signal input terminal is full-wave rectified;

said switching means having a switching rate which coincides with the frequency of said input a-c signal;

said switching means comprising:

a source of potential;

a first field-effect transistor having a gate coupled to said source of potential, a drain coupled to said signal input terminal, and a source coupled to said non-inverting input terminal;

a phase reference signal source;

a second field-effect transistor having a drain coupled to said gate of said first transistor, a gate coupled to said phase reference signal source, and a source which is grounded;

a third field-effect transistor having a gate coupled to said phase reference signal source, a drain coupled to said source of said first transistor, and a source coupled to said source of said transistor; and means for biasing the substrate of each of said transistors.

2. Apparatus as described in claim 1 wherein said switching means is of the double-throw single-pole variety and the switching rate is controlled by the oscillations of a square-wave signal.

3. Full-wave modulator-demodulator amplifier apparatus comprising:

an operational amplifier having an inverting input terminal, a non-inverting input terminal and an output terminal;

an a-c signal input terminal;

means for coupling said signal input terminal to said inverting input terminal;

feedback means for feeding the signal at said output terminal to said inverting input terminal;

a voltage source;

a first field-effect transistor having a gate connected to said voltage source, a drain connected to said signal input terminal, and a source connected to said non-inverting input terminal;

a phase reference signal source;

a second field-effect transistor having a gate connected to said phase reference signal source, a drain connected to said gate of said first field-effect transistor; and a source which is grounded;

a third field-effect transistor having a gate connected to said phase reference signal source, a drain connected to said source of said first transistor, and a source connected to said source of said second transistor; and means for biasing the substrate of each of said transistors.

4. Apparatus as described in claim 3 wherein said phase reference signal is a square wave and the oscillations of said square wave coincide with the oscillations of said a-c input signal.

* * * * *